US010164599B2

(12) United States Patent
Zhou et al.

(10) Patent No.: US 10,164,599 B2
(45) Date of Patent: Dec. 25, 2018

(54) CIRCUITRY WITH A NOISE ATTENUATION CIRCUIT TO REDUCE NOISE GENERATED BY AN AGGRESSOR CIRCUIT

(71) Applicant: MediaTek Singapore Pte. Ltd., Singapore (SG)

(72) Inventors: Rong Zhou, Singapore (SG); Yipin Wu, Singapore (SG)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 28 days.

(21) Appl. No.: 15/381,219

(22) Filed: Dec. 16, 2016

(65) Prior Publication Data
US 2018/0069523 A1    Mar. 8, 2018

Related U.S. Application Data

(60) Provisional application No. 62/383,707, filed on Sep. 6, 2016.

(51) Int. Cl.
*H03H 7/06* (2006.01)
*H03H 7/01* (2006.01)
*H01L 23/58* (2006.01)
*H03K 19/003* (2006.01)

(52) U.S. Cl.
CPC ............ *H03H 7/06* (2013.01); *H01L 23/58* (2013.01); *H03H 7/0153* (2013.01); *H03K 19/00346* (2013.01)

(58) Field of Classification Search
CPC .............................. H03H 7/06; H03H 7/0153
USPC .................................................. 333/172, 185
See application file for complete search history.

(56) References Cited

U.S. PATENT DOCUMENTS

| 4,893,099 | A | 1/1990 | Waller, Jr. |
| 5,841,329 | A * | 11/1998 | Dutilleul .................. H03H 7/07 333/175 |
| 6,346,859 | B1 | 2/2002 | Saitou |
| 9,615,460 | B2 | 4/2017 | Wu |
| 2001/0045873 | A1 | 11/2001 | Suzuki et al. |
| 2014/0035689 | A1* | 2/2014 | Ozawa .................. H03B 5/364 331/158 |
| 2015/0326209 | A1 | 11/2015 | Ozawa et al. |

FOREIGN PATENT DOCUMENTS

| TW | 201424253 A | 6/2014 |
| TW | I522016 B | 2/2016 |

* cited by examiner

*Primary Examiner* — Rakesh Patel
(74) *Attorney, Agent, or Firm* — McClure, Qualey & Rodack, LLP

(57) ABSTRACT

A circuitry includes a functional circuit providing a predetermined function and a resistive device coupled between a power supply and the functional circuit to contribute a resistance on a power supplying path for the power supply to supply power to the functional circuit. The resistance is tunable.

12 Claims, 10 Drawing Sheets

CIRCUITRY WITH A NOISE ATTENUATION CIRCUIT TO REDUCE NOISE GENERATED BY AN AGGRESSOR CIRCUIT

CROSS REFERENCE TO RELATED APPLICATIONS

This application claims the benefit of U.S. Provisional Application No. 62/383,707 filed 2016 Sep. 6 and entitled "Noise Attenuation for RF SoC Digital Always-on Region," the entire contents of which are hereby incorporated by reference.

BACKGROUND OF THE INVENTION

Field of the Invention

The invention relates to a circuitry, and more particularly to a circuitry with a noise attenuation circuit to reduce noise generated by an aggressor circuit.

Description of the Related Art

Nowadays, most consumer products are implemented with system-on-chip (SoC) technology. A system on a chip or system on chip is an integrated circuit (IC) that integrates all components of a computer or other electronic system into a single chip. It may contain digital, analog, mixed-signal, and often radio-frequency functions—all on a single chip substrate. SoCs are very common in the mobile electronics market because of their low power-consumption and low-cost.

However, because all the circuits are placed very close to each other, noise generated by one circuit may become interference to other circuits.

FIG. 1 shows an exemplary SoC structure. As shown in FIG. 1, the circuits 101 and 102 are integrated on the same die substrate. When the circuit 101 operates, undesirable noise will be generated and coupled to the circuit 102 via the parasitic capacitor or inductor in the circuit. The noise generated by the circuit 101 becomes interference to the circuit 102. In this manner, the circuit 101 becomes an aggressor circuit and the circuit 102 becomes a victim circuit.

To reduce the noise generated by an aggressor circuit, novel circuitry designs are proposed.

BRIEF SUMMARY OF THE INVENTION

Circuitries are provided. An exemplary embodiment of a circuitry comprises a functional circuit providing a predetermined function and a resistive device coupled between a power supply and the functional circuit to contribute a resistance on a power supplying path for the power supply to supply power to the functional circuit. The resistance is tunable.

An exemplary embodiment of a circuitry comprises a functional circuit providing a predetermined function, a resistive device and a capacitor. The resistive device is coupled between a power supply and the functional circuit to contribute a resistance on a power supplying path for the power supply to supply power to the functional circuit. The resistance is tunable. The resistive device and the capacitor form a low pass filter to filter out high-frequency noise generated from the power supply.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
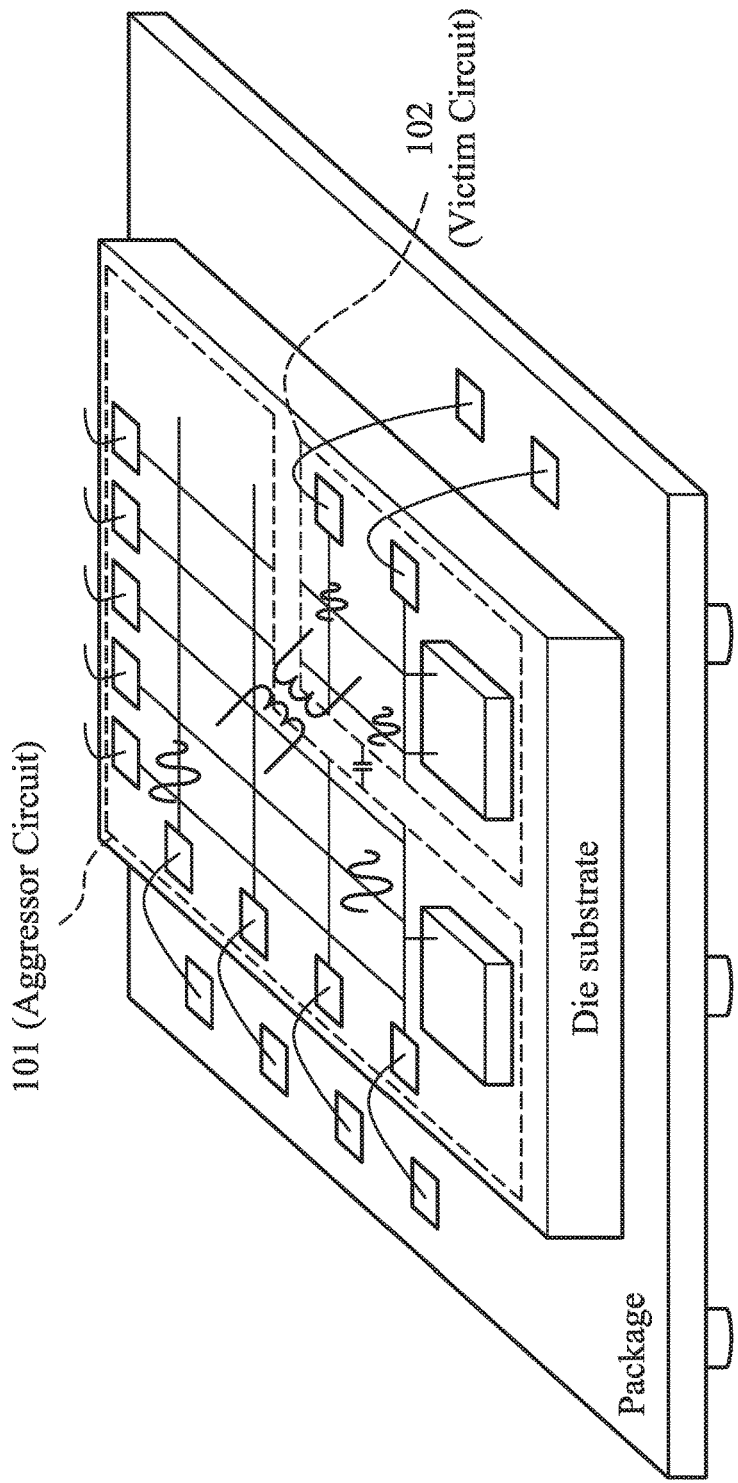
FIG. 1 shows an exemplary SoC structure.
Figure 2:
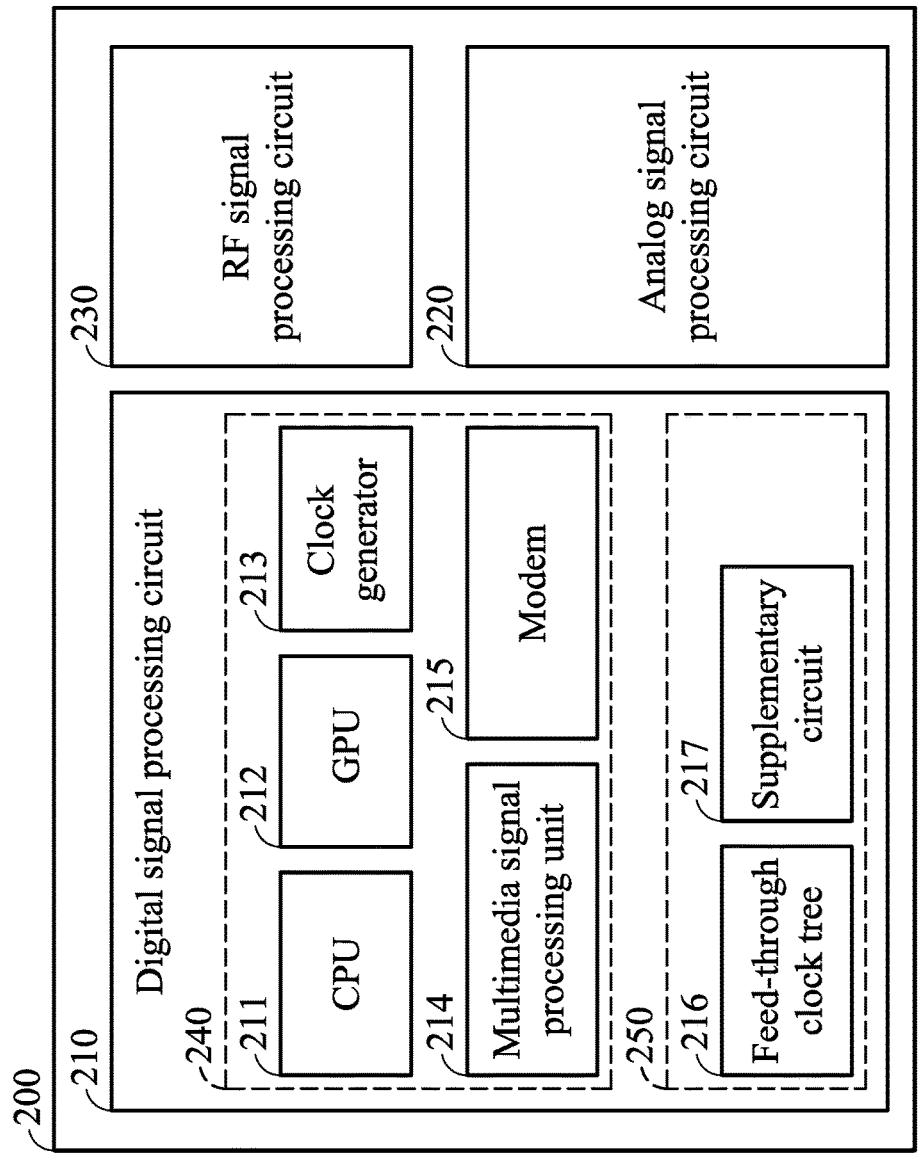
FIG. 2 shows an exemplary circuitry according to an embodiment of the invention.

FIG. 2 shows an exemplary circuitry according to an embodiment of the invention. According to an embodiment of the invention, the circuitry 200 may be an SoC comprised in an electronic device, such as a notebook, a cellular phone, a portable gaming device, a portable multimedia player, a Global Positioning System (GPS), a receiver, or others. The circuitry 200 may comprise a plurality of functional circuits each providing a predetermined function, such as a digital signal processing circuit 210, an analog signal processing circuit 220 and a radio frequency signal processing circuit 230. The functional circuits are integrated on the same die substrate.

The digital signal processing circuit 210 may comprise a plurality of hardware component circuits to perform digital signal processing. As an example, the digital signal processing circuit 210 may be a central processing unit (CPU) 211, a graphics processing unit (GPU) 212, a clock generator 213, a multimedia signal processing unit 214, a modulator-demodulator (modem) 215, a feed-through clock tree 216, or a supplementary circuit 217.

It should be noted further that, in order to clarify the concept of the invention, FIG. 2 presents simplified block diagrams in which only the elements relevant to the invention are shown. Therefore, the invention should not be limited to what is shown in FIG. 2.

The CPU 211 controls the main operations of the electronic device. The GPU 212 manipulates computer graphics and performs image processing. The clock generator 213 generates clock signals. The clock generator 213 may be, as an example, a phase locked loop (PLL). The multimedia signal processing unit 214 performs multimedia signal processing. The modem 215 handles communication protocol operations and processes IF or baseband signals received from or to be transmitted to the RF signal processing circuit 230. The feed-through clock tree 216 is another circuit to generate clock signals. The supplementary circuit 217 may represent any non-mentioned circuits which provide supplementary functions.

The analog signal processing circuit 220 may comprise a plurality of hardware component circuits to perform analog signal processing. In some embodiments of the invention, the RF signal processing 230 may be regarded as a part of the analog signal processing circuit 220 via the air interface.

According to an embodiment of the invention, the RF signal processing circuit 230 may convert the received RF signals to intermediate frequency (IF) or baseband signals to be processed, or receive the IF or baseband signals from the modem 215 and convert the received signals to wireless RF signals to be transmitted to a network device.

According to an embodiment of the invention, the RF signal processing circuit 230 may comprise a plurality of hardware component circuits to perform radio frequency conversion and RF signal processing. For example, the RF signal processing circuit 230 may comprise a power amplifier for amplifying the RF signals, a filter for filtering unwanted portions of the RF signals and/or a mixer for performing radio frequency conversion. According to an embodiment of the invention, the radio frequency may be, for example, 900 MHz or 1800 MHz for a Global System for Mobile communication (GSM), 1900 MHz for a Universal Mobile Telecommunications System (UMTS), 2400 MHz or 5000 MHz for a WiFi communication system, the frequency of any specific frequency band for a Long-Term Evolution (LTE) system, or others.

According to an embodiment of the invention, the digital signal processing circuit 210 may be further divided into an always-on region (also called always-on domain) 240 and a low-power region (also called low-power domain) 250. The devices in the always-on region 240 may be regarded as always-on circuits. The always-on circuit is turned on and does not shut down when the electronic device powers on and operates, so as to maintain the basic functions of the electronic device.

The devices in the low-power region 250 may be regarded as low-power circuits. The low-power circuit can be turned off, when they do not have to operate or stand by, during the operations of the electronic device, so as to reduce power consumption of the electronic device.

Figure 3A:
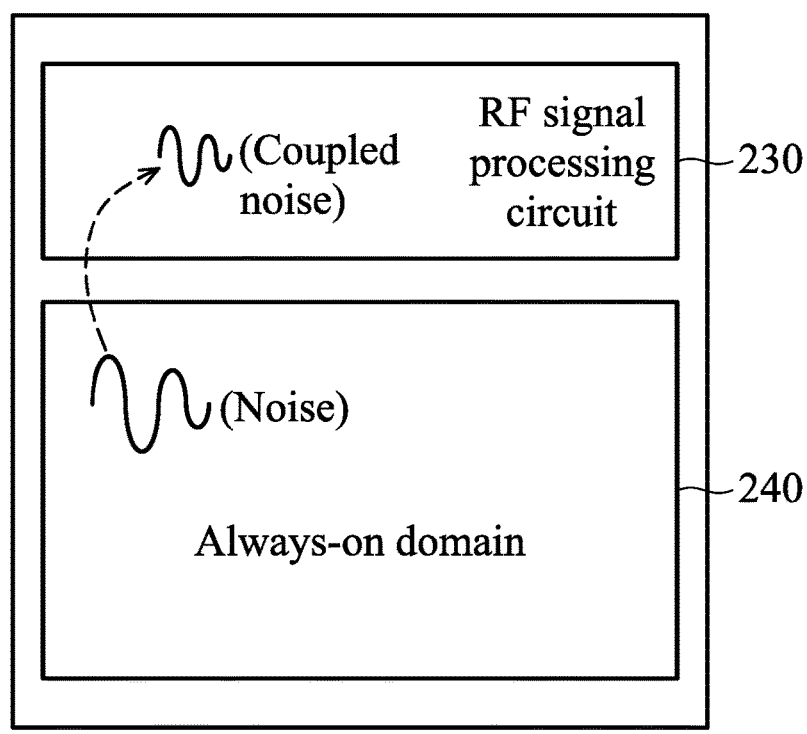
FIG. 3A is a schematic diagram showing the noise generated by the circuit in the always-on domain becomes an interference to the RF signal processing circuit.

Because the always-on circuits in the always-on region 240 are always turned on, one or more of the always-on circuits in the always-on region 240 shown in FIG. 2 may become the aggressor circuit described above to cause interference to a victim circuit (such as the RF signal processing circuit 230 as shown in FIG. 2). FIG. 3A is a schematic diagram showing the noise generated by the circuit in the always-on domain becomes an interference to the RF signal processing circuit 230.

Undesirable noise, such as high-frequency noise, is generated when an always-on circuit draws current from a power source, such as a power supply. Because the time needed to draw the current and the amount of current to be drawn vary with different system requirements, the waveform of the current is irregular and unpredictable. Therefore, the noise generated by the always-on circuit when drawing current from a power supply becomes interference to other circuits.

Figure 3B:
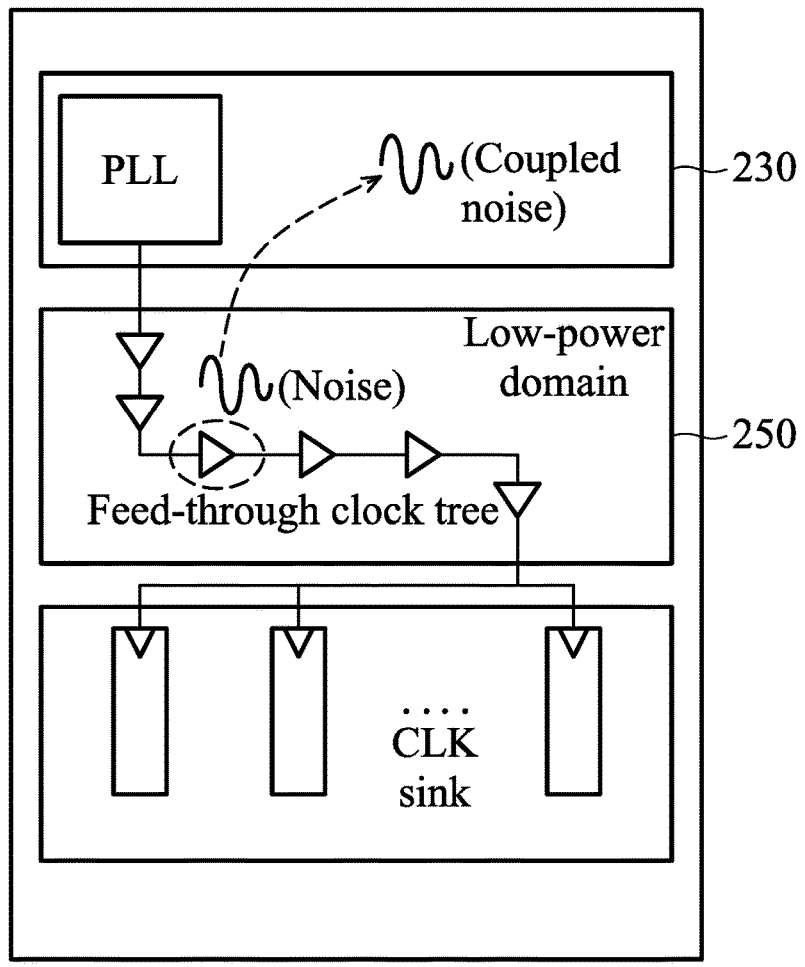
FIG. 3B is a schematic diagram showing the noise generated by the feed-through clock tree circuit in the low power domain becomes an interference to the RF signal processing circuit.

In addition, one or more of the low-power circuits in the low-power region 250 may become the aggressor circuit described above to cause interference to a victim circuit (such as the RF signal processing circuit 230 shown in FIG. 2) when the low-power circuit draws current from the power supply in the always-on region 240. Therefore, the noise generated by the low-power circuit also becomes interference to other circuits. FIG. 3B is a schematic diagram showing the noise generated by the feed-through clock tree circuit in the low power domain becomes an interference to the RF signal processing circuit 230. The feed-through clock tree which draws current from the power supply in the always-on region 240 may be coupled to the PLL of the RF signal processing circuit 230.

When the frequency of the undesirable noise is close to the radio frequency of the RF signal processing circuit 230, the noise will greatly interfere with the RF signal processing circuit 230.

To reduce the noise generated by an aggressor circuit, novel circuitry designs are proposed.

Figure 4A:
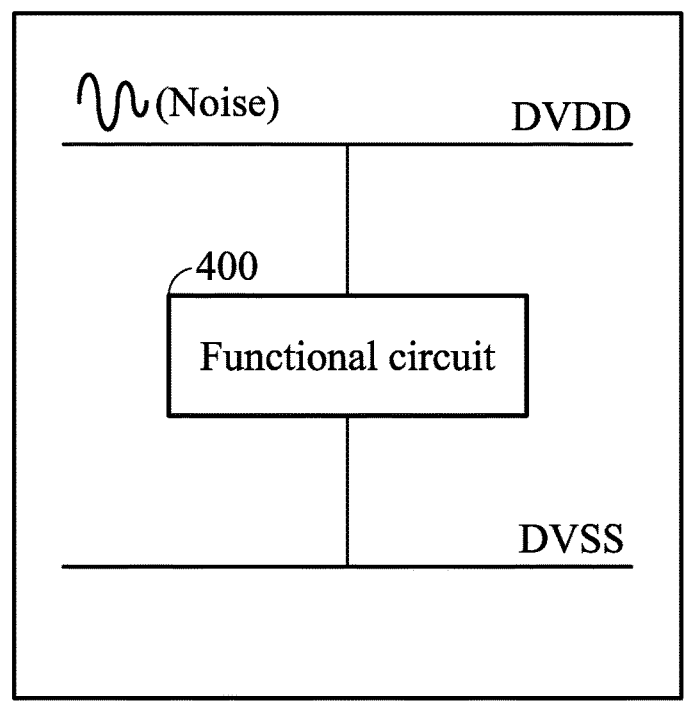
FIG. 4A is a schematic diagram showing the power supplying paths to a functional circuit.

FIG. 4A is a schematic diagram showing the power supplying paths to a functional circuit in the original design. The functional circuit 400 may be any circuit comprised in the circuitry of the electronic device and providing a predetermined function, such as the circuits shown in FIG. 2. The functional circuit 400 may also be any standard cell comprised in the circuit of the electronic device shown in FIG. 2 for providing a predetermined function.

As shown in FIG. 4A, in the original design, the functional circuit 400 is directly connected to the power supply DVDD and DVSS. Noise is generated when the functional circuit 400 draws current, as discussed above. The noise will be coupled to other circuits via a coupling path to become interference.

To solve this problem, in the proposed circuitry designs, a noise attenuation circuit is introduced to attenuate such noise.

Figure 4B:
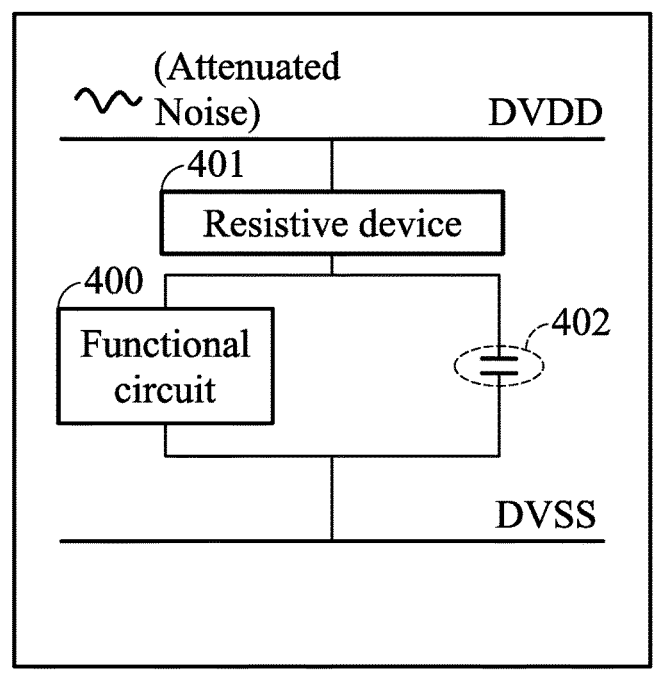
FIG. 4B is a schematic diagram showing the power supplying paths to a functional circuit according to an embodiment of the invention.

FIG. 4B is a schematic diagram showing the power supplying paths to a functional circuit according to an embodiment of the invention. The functional circuit 400 may be any circuit comprised in the circuitry of the electronic device and providing a predetermined function, such as the circuits shown in FIG. 2. The functional circuit 400 may also be any standard cell comprised in the circuit of the electronic device shown in FIG. 2 for providing a predetermined function.

According to an embodiment of the invention, a noise attenuation circuit is introduced on a power supplying path from the power supply DVDD to the functional circuit 400. The noise attenuation circuit may at least comprise a resistive device 401 and a capacitor 402.

The resistive device 401 is coupled between the power supply DVDD and the functional circuit 400 to contribute a resistance on a power supplying path for the power supply DVDD to supply power to the functional circuit 400. According to an embodiment of the invention, the resistance contributed by the resistive device 401 is tunable.

It should be noted that in the embodiments of the invention, the resistive device 401 is independent from the functional circuit 400. In other words, the functional circuit 400 can still operate and provide the predetermined function without the resistive device 401. Therefore, it should be understood that the resistive device 401 is different from the intrinsic resistive device in the functional circuit 400.

The capacitor 402 is coupled to the functional circuit 400 and the resistive device 401. According to an embodiment of the invention, the capacitor 402 may be a decoupling capacitor.

The resistive device 401 and the capacitor 402 form a low pass filter to filter out high-frequency noise generated from the power supply DVDD. As shown in FIG. 4B, the noise generated from the power supply DVDD is attenuated compared to the original design. As the noise is attenuated, the interference to the victim circuit can be reduced.

The noise is attenuated because the capacitor 402 may store energy to act as another power supply for the functional circuit 400. In this manner, the current (energy) drawn from the power supply DVDD can be reduced, and the noise can be reduced as well.

According to an embodiment of the invention, then capacitor 402 may be an intrinsic capacitor in the functional circuit 400 or an added capacitor. It should be noted that when the capacitor 402 is an intrinsic capacitor in the functional circuit 400, the capacitor 402 accompanying other components in the functional circuit 400 are utilized to provide the predetermined function. When the capacitor 402 is an added capacitor, the capacitor 402 is independent from the functional circuit 400 and the functional circuit 400 can still operate and provide the predetermined function without the capacitor 402.

According to an embodiment of the invention, the resistance contributed by the resistive device 401 is tunable, such that a cut-off frequency of the low pass filter can be flexibly design based on the filtering requirements. In an embodiment of the invention, the cut-off frequency of the low pass filter is preferably much smaller than the radio frequency of the RF signal processing circuit 230.

Figure 5:
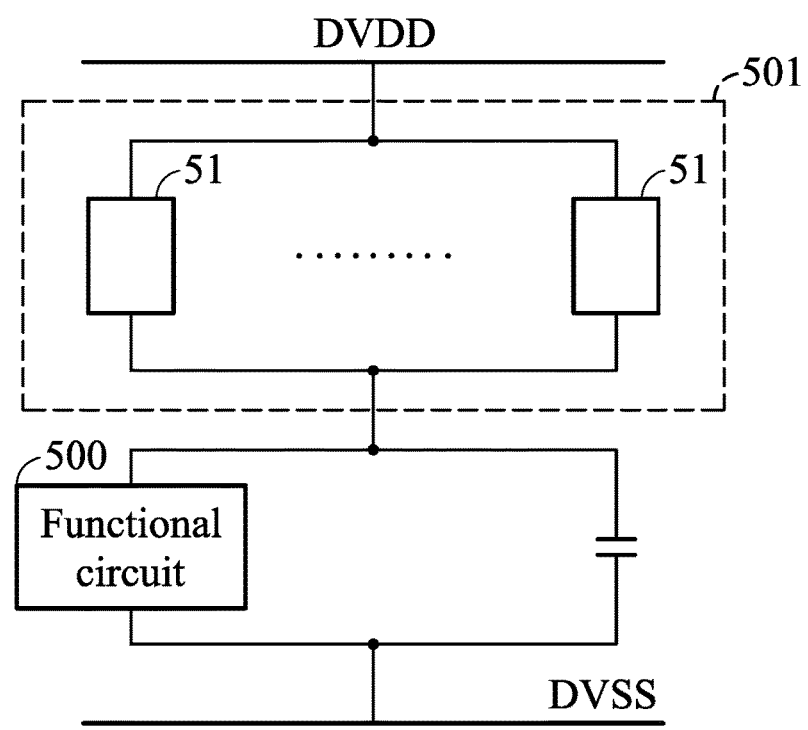
FIG. 5 is a schematic diagram of the proposed circuitry with a noise attenuation circuit according to a first embodiment of the invention.

FIG. 5 is a schematic diagram of the proposed circuitry with a noise attenuation circuit according to a first embodiment of the invention. According to an embodiment of the invention, the resistive device 501 may comprise a plurality of power switches 51 coupled between the power supply DVDD and the functional circuit 500 to form a plurality of power-supply chains. The power switch 51 may be implemented as a standard cell or cells.

It should be noted that, for simplicity, only one power switch 51 in a power-supply chain is shown. However, the invention should not be limited thereto. Each power-supply chain may comprise one or more switches coupled between the power supply DVDD and the functional circuit 500.

Unlike the original design, in which the functional circuit is directly connected to the power supply DVDD to receive power therefrom, in the first embodiment of the invention, the resistive devices, such as the power switches 51 shown in FIG. 5, are introduced on a power supplying path from the power supply DVDD to the standard cell. Therefore, in the embodiments of the invention, the functional circuit 500 receives a local power which is slightly smaller than the power supply DVDD.

When the power switches 51 on a power-supply chain are turned on, the corresponding power supplying path is conducted and a resistance is contributed on the corresponding power supplying path. The more power-supply chains are turned on, it is equivalent as the more resistors are coupled in parallel between the power supply DVDD and the functional circuit 500.

In an embodiment of the invention, the functional circuit 500 may be an always-on circuit which is turned on and does not shut down when the electronic device powers on, as discussed above. Therefore, in this embodiment, at least one power-supply chain is always turned on, and the remaining power-supply chains are selectively turned on in response to corresponding control signals.

Figure 6:
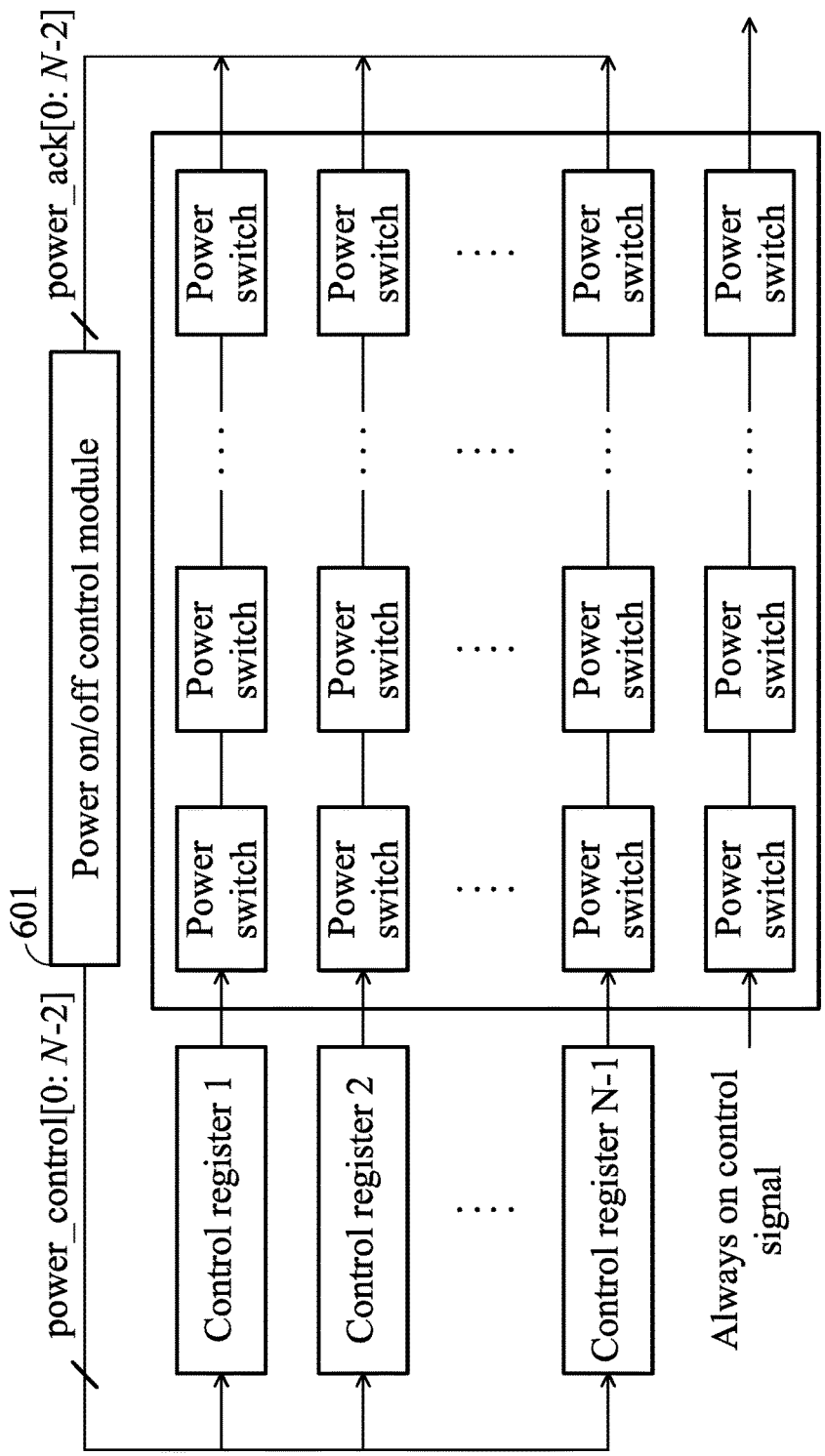
FIG. 6 is a schematic diagram showing the control circuit of the power switches according to an embodiment of the invention.

FIG. 6 is a schematic diagram showing the control circuit of the power switches according to an embodiment of the invention. An always-on control signal is provided to one power-supply chain, so as to always turn on the power switches in the power-supply chain. The power on/off control module 601 generates one or more power control signals power_control [0:(N−2)] and provides a power control signal power_control to a corresponding control register, where N is a positive integer greater than or equal to 2. Each control register is coupled to a power-supply chain to control the on/off of the power switches thereon. The power acknowledge signals power_ack will be fed back to the power on/off control module 601 to indicate whether the corresponding power-supply chain is successfully turned on or not. In the embodiments of the invention, the power on/off control module 601 may be implemented by a software module or a hardware circuit, or a combination thereof.

It should be noted that, in an embodiment of the invention, the power-supply chains shown in FIG. 6 illustrate the turn on/off signal control. Each power switch has another two power pins (not shown in FIG. 6) that are coupled to the power supply DVDD and the functional circuit respectively, such that the power-supply chains are coupled in parallel between the power supply DVDD and the functional circuit shown in FIG. 5.

Figure 7:
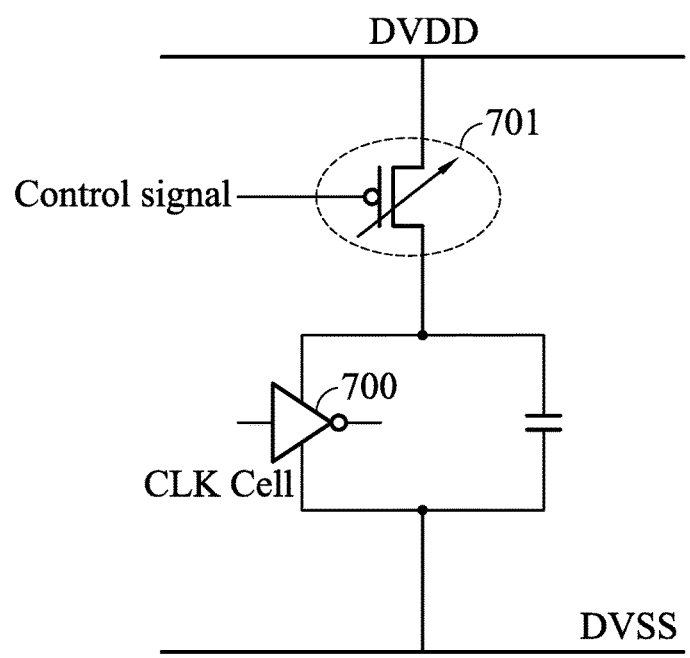
FIG. 7 is a schematic diagram of the proposed circuitry with a noise attenuation circuit according to a second embodiment of the invention.

FIG. 7 is a schematic diagram of the proposed circuitry with a noise attenuation circuit according to a second embodiment of the invention. In the second embodiment of the invention, the functional circuit may be a standard cell in the digital signal processing circuit 210. As an example, the functional circuit may be a clock cell 700 in the feed-through clock tree 216.

According to an embodiment of the invention, the resistive device may be implemented by a transistor 701 with a tunable resistance coupled between the power supply DVDD and the functional circuit. According to another embodiment of the invention, the resistive device may also be implemented by a variable resistor with a tunable resistance coupled between the power supply DVDD and the functional circuit.

Unlike the original design, in which a standard cell is usually directly connected to the power supply DVDD to receive power therefrom, in the second embodiment of the invention, the resistive device, such as the transistor 701 shown in FIG. 7, is introduced on a power supplying path from the power supply DVDD to the standard cell. Therefore, in the embodiments of the invention, the clock cell 700 receives a local power which is slightly less than the power supply DVDD.

It should be noted that, in a preferred embodiment of the invention, when the functional circuit is a standard cell, such as a clock cell 700 in the feed-through clock tree 216 shown in FIG. 7, all of the same standard cells in a predetermined circuit are preferably implemented based on the proposed circuitry. As an example, when the feed-through clock tree 216 comprise six clock cells coupled in serial, all of the six clock cells are preferably replaced by the structure shown in FIG. 7, so as to reduce the noise.

According to an embodiment of the invention, a control signal (may contain one bit or multiple bits) provided to a gate electrode of the transistor 701 is tunable, so as to control the resistance contributed by the transistor 701. The control signal may be provided by control register that further controlled by power on/off control module 601 in FIG. 6.

Figure 8:
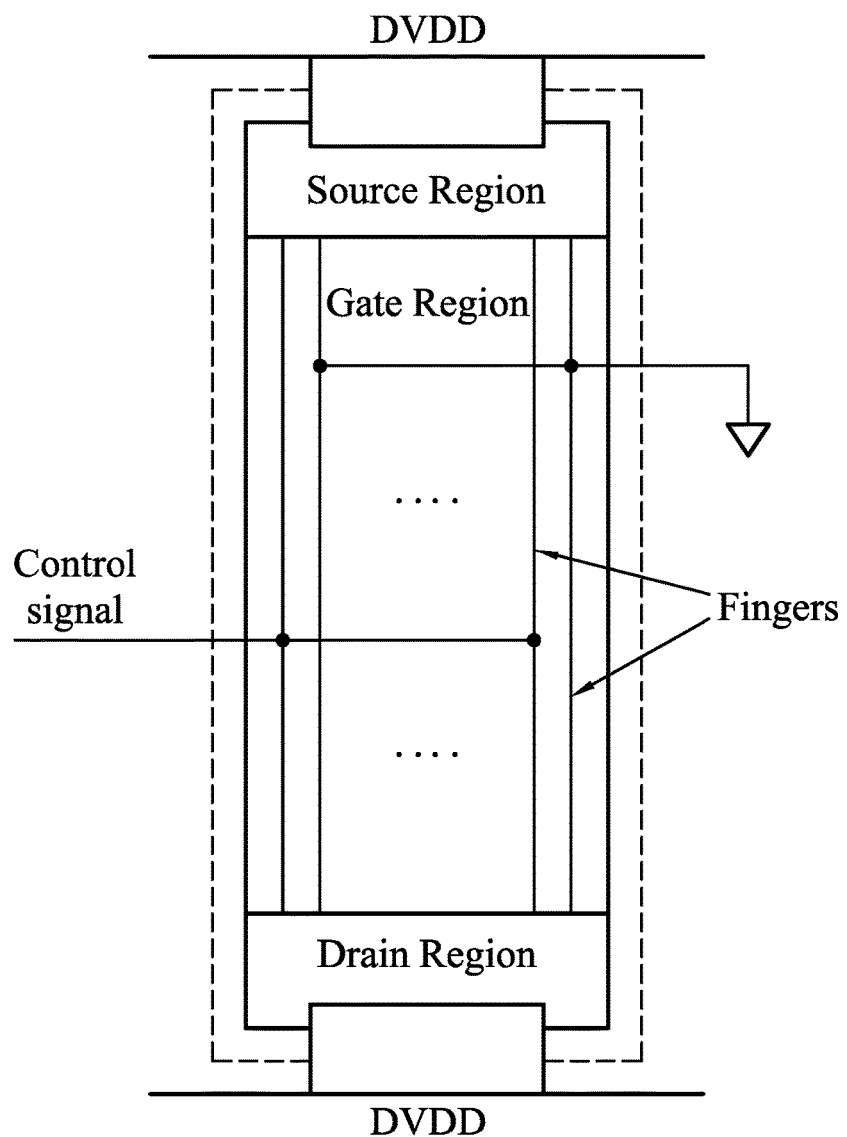
FIG. 8 is a schematic diagram showing the fingers in the gate region of the transistor according to an embodiment of the invention.

According to an embodiment of the invention, the resistance contributed by the transistor 701 may be tunable by controlling the number of turned-on fingers of the transistor 701. FIG. 8 is a schematic diagram showing the fingers in the gate region of the transistor according to an embodiment of the invention. Some fingers may be always turned on by connecting to ground (logic 0). Other fingers' turn on/off may be tunable and controlled by input control signal. The fingers are turned on when the control signal is logic 0, while the fingers are turned off when the control signal is logic 1. The more fingers are turned-on, the more power conducting paths are conducted in parallel, and the smaller resistance is introduced between power supply DVDD and CLK cell 700.

It should be noted that the transistor 701 is preferably controlled to be not completely turned off, so as to provide local power to the standard cell as discussed above.

As discussed above, in the embodiments of the invention, since the current (energy) drawn from the power supply DVDD can be reduced, the noise can be reduced as well and the high-frequency noise can be filtered out. In this manner, the interference to the victim circuit can be reduced.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A circuitry, comprising:
   a functional circuit, providing a predetermined function; and
   a resistive device, coupled between a power supply and the functional circuit to contribute a resistance on a power supplying path for the power supply to supply power to the functional circuit,
   wherein the resistance is tunable, and
   wherein the resistive device and an intrinsic capacitor of the functional circuit form a low pass filter to filter out high-frequency noise generated by the power supply.

2. The circuitry as claimed in claim 1, wherein the functional circuit is a standard cell.

3. The circuitry as claimed in claim 2, wherein the resistive device is a variable resistor.

4. The circuitry as claimed in claim 2, wherein the resistive device is a transistor, and wherein a control signal provided to a gate electrode of the transistor is tunable.

5. The circuitry as claimed in claim 1, wherein the circuitry is comprised in an electronic device and the functional circuit is an always-on circuit which is turned on and does not shut down when the electronic device powers on.

6. The circuitry as claimed in claim 5, wherein the resistive device comprises:
   a plurality of power switches, coupled between the power supply and the functional circuit to form a plurality of power-supply chains,
   wherein at least one power-supply chain is always turned on, and the remaining power-supply chains are selectively turned on in response to corresponding control signals.

7. A circuitry, comprising:
   a functional circuit, providing a predetermined function;
   a resistive device, coupled between a power supply and the functional circuit to contribute a resistance on a power supplying path for the power supply to supply power to the functional circuit, wherein the resistance is tunable; and
   a capacitor, wherein the resistive device and the capacitor form a low pass filter to filter out high-frequency noise generated from the power supply, and wherein the capacitor is an intrinsic capacitor comprised in the functional circuit.

8. The circuitry as claimed in claim 7, wherein the circuitry is comprised in an electronic device and the functional circuit is an always-on circuit which is turned on and does not shut down when the electronic device powers on.

9. The circuitry as claimed in claim 8, wherein the resistive device comprises:
   a plurality of power switches, coupled between the power supply and the functional circuit to form a plurality of power-supply chains,
   wherein at least one power-supply chain is always turned on, and the remaining power-supply chains are selectively turned on in response to corresponding control signals.

10. The circuitry as claimed in claim 7, wherein the functional circuit is a standard cell.

11. The circuitry as claimed in claim 10, wherein the resistive device is a variable resistor.

12. The circuitry as claimed in claim 10, wherein the resistive device is a transistor, and wherein a control signal provided to a gate electrode of the transistor is tunable.

* * * * *